United States Patent
Ding et al.

(10) Patent No.: US 9,222,972 B1
(45) Date of Patent: Dec. 29, 2015

(54) ON-DIE JITTER GENERATOR

(75) Inventors: Weiqi Ding, Fremont, CA (US); Sergey Shumarayev, Los Altos Hills, CA (US); Mingde Pan, Morgan Hill, CA (US); Peng Li, Palo Alto, CA (US); Masashi Shimanouchi, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1446 days.

(21) Appl. No.: 12/884,747

(22) Filed: Sep. 17, 2010

(51) Int. Cl.
*G01R 31/02* (2006.01)
*G01R 31/317* (2006.01)

(52) U.S. Cl.
CPC ................................. *G01R 31/31709* (2013.01)

(58) Field of Classification Search
USPC .................... 324/612, 713; 714/704, 724, 725
See application file for complete search history.

(56) References Cited

U.S. PATENT DOCUMENTS

| | | | |
|---|---|---|---|
| 7,373,561 B2 | 5/2008 | Baumer et al. | |
| 7,539,242 B2 | 5/2009 | Yoshioka | |
| 7,555,039 B2 | 6/2009 | Romero | |
| 7,743,288 B1 | 6/2010 | Wang | |
| 2001/0021987 A1 | 9/2001 | Govindarajan et al. | |
| 2004/0223559 A1* | 11/2004 | Hill | 375/306 |
| 2005/0044463 A1* | 2/2005 | Frisch | 714/738 |
| 2005/0271131 A1* | 12/2005 | Hafed et al. | 375/224 |
| 2007/0156360 A1 | 7/2007 | Romero | |
| 2008/0025383 A1* | 1/2008 | Li | 375/226 |
| 2008/0133958 A1 | 6/2008 | Cranford et al. | |
| 2008/0150599 A1* | 6/2008 | Cranford et al. | 327/164 |
| 2009/0077541 A1 | 3/2009 | Jeffries et al. | |
| 2009/0302955 A1* | 12/2009 | Hsu | 331/78 |
| 2010/0026314 A1* | 2/2010 | Schuttert | 324/555 |
| 2010/0097071 A1* | 4/2010 | Lee et al. | 324/537 |
| 2011/0221477 A1 | 9/2011 | Ding et al. | |

FOREIGN PATENT DOCUMENTS

| | | |
|---|---|---|
| CN | 201467137 U | 5/2010 |
| EP | 1193931 A2 | 4/2002 |
| EP | 1385014 A2 | 1/2004 |
| EP | 1646882 | 2/2005 |
| WO | WO 2005/015251 A1 | 2/2005 |
| WO | WO-2009/003129 A2 | 12/2008 |

OTHER PUBLICATIONS

Extended European Search Report issued in European Patent Application No. 11826056.1 dated Aug. 5, 2013 (16 pages).
"Using the On-Chip Signal Quality Monitoring Circuitry (EyeQ) Feature in Stratix IV Transceivers," Sep. 2010, pp. 1-10, Altera Corporation, www.altera.com/literature/an/an605.pdf.
Walsh, K., "Monitor opens an eye to high-speed SERDES performance," Embedded Computing Design Magazine, Nov. 13, 2009, pp. 1-4, www.embedded-computing.com/article-id/?4302.

(Continued)

*Primary Examiner* — Vincent Q Nguyen
(74) *Attorney, Agent, or Firm* — Mauriel Kapouytian Woods LLP; Ararat Kapouytian

(57) ABSTRACT

An IC that includes a jitter generator, where the jitter generator is integral with the IC and generates non-intrinsic jitter, is provided. In one implementation, the non-intrinsic jitter is used to measure a characteristic of the IC. In one implementation, the non-intrinsic jitter is used to test jitter tolerance of the IC. In yet another implementation, the non-intrinsic jitter is used to test another IC coupled to the IC that includes the jitter generator.

20 Claims, 3 Drawing Sheets

(56) References Cited

OTHER PUBLICATIONS

U.S. Appl. No. 12/082,343, filed Apr. 9, 2008, Ding et al.
U.S. Appl. No. 12/884,305, filed Sep. 17, 2010, Li, Peng.
U.S. Appl. No. 12/884,923, filed Sep. 17, 2010, Ding et al.
U.S. Appl. No. 12/082,483, filed Apr. 11, 2008, Ding et al.
U.S. Appl. No. 12/630,674, filed Dec. 3, 2009, Ding et al.
U.S. Appl. No. 12/762,848, filed Apr. 19, 2010, Li et al.
International Search Report and Written Opinion issued in Application No. PCT/US2011/052028 dated Apr. 13, 2012.
Official Communication issued in European Patent Application No. 11826056.1 dated Jul. 7, 2014 (4 pages).
Official Communication issued in European Patent Application No. 11826056.1 dated Mar. 26, 2015 (9 pages).
First Office Action issued in Chinese Patent Application No. 201180044562.0 dated Feb. 2, 2015 (21 pages).
Summons to Attend Oral Proceedings Pursuant to Rule 115(1) EPC for European Application No. 11826056.1 mailed on Oct. 26, 2015, pp. 1-10.
"Literature: Application Notes", web.archive.org/web/20100721085313/http://www/altera.com/literature/lit-an.jsp?, Jul. 21, 2010, pp. 1-8.

* cited by examiner

ON-DIE JITTER GENERATOR

BACKGROUND

The present invention relates to jitter generators.

A jitter generator is used to test integrated circuits (ICs) for jitter tolerance or to measure other characteristics of ICs. The jitter generator generates jitter which is input to the IC and the response of the IC is observed to determine whether the IC functions as intended despite the jitter. This allows testing the IC to determine whether it meets certain jitter related specifications.

Jitter generators are part of test and measurement equipment devices that are typically expensive. This is particularly true of test and measurement equipment devices used to test ICs interfacing at higher data rates (e.g., at 1 giga bits per second (Gbps) or higher), as such test and measurement equipment devices have better and more accurate components and more complex instrumentation architectures. Furthermore, the jitter generators in test and measurement equipment devices are generally used to test an IC before it is installed on a system board. Jitter generators in test and measurement equipment devices cannot be used to test an IC on a system board without special impedance matched connectors for connecting the test and measurement equipment device to the system board on which the IC is installed. Thus, in addition to being expensive, conventional test and measurement equipment devices are also more difficult to use in the field, i.e., to test ICs installed on a system board.

Embodiments of the present invention arise in this context.

SUMMARY

In one aspect, an embodiment of the present invention provides an IC including a jitter generator, where the jitter generator is integral with the IC and generates non-intrinsic jitter. In one embodiment, the non-intrinsic jitter is used to measure a characteristic of the IC. In one embodiment, the non-intrinsic jitter is used to test jitter tolerance of the IC. In yet another embodiment, the non-intrinsic jitter is used to test another IC that is coupled to the IC including the jitter generator.

Embodiments of the IC of the present invention including a jitter generator allow for avoiding the use of expensive test and measurement equipment devices generally used for testing ICs. Moreover, they allow for testing ICs in the field without using special impedance matched connectors that are used for connecting a test and measurement equipment device to the system board on which the IC is installed.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
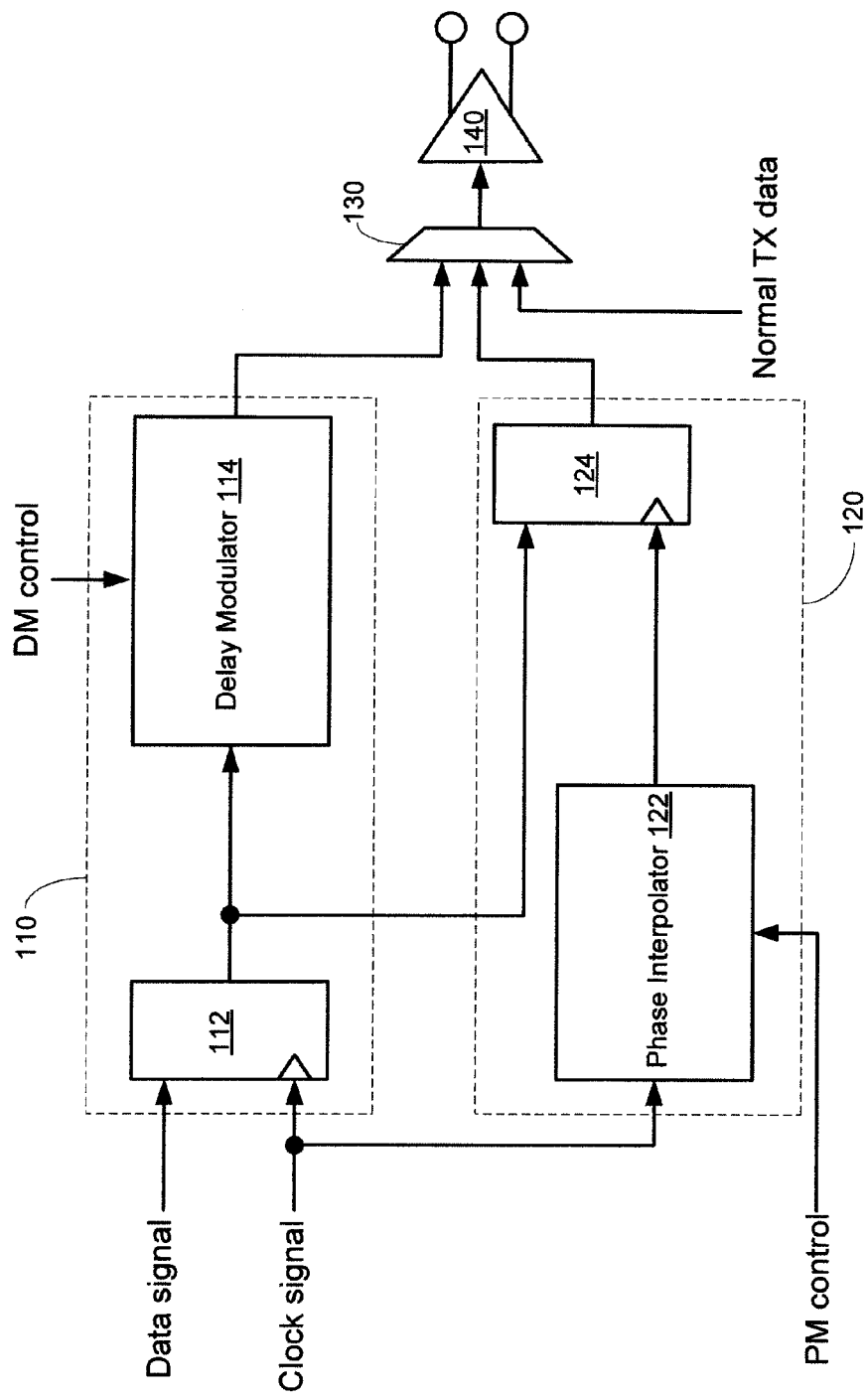
FIG. 1 is a block diagram of one embodiment of the jitter generator of the present invention.

FIG. 1 is a block diagram of one embodiment of the jitter generator of the present invention. In FIG. 1, jitter generator 100 includes low frequency jitter generator (LFJG) 110, high frequency jitter generator (HFJG) 120, multiplexer 130, and transmit driver 140. Jitter generator 100 may also herein be referred to as pattern and jitter generator 100, since in addition to generating jitter, jitter generator 100 also provides a data pattern signal.

LFJG 110 includes register 112 and delay modulator 114 coupled to register 112. Delay modulator 114 is also coupled to multiplexer 130. HFJG 120 includes phase interpolator 122 and register 124 coupled to phase interpolator 122 and register 112. Register 124 is also coupled to multiplexer 130. It is to be noted that the HFJG may also be defined to include register 112 in addition to phase interpolator 122 and register 124.

Register 112 receives a data signal on its data input terminal and a clock signal on its clock input terminal. In one embodiment, register 112 receives a test data signal on its data input terminal and a transmit clock signal on its clock input terminal. The test data signal may, for example, be a pseudo random data signal or a fixed data signal. The test data signal may be received from soft intellectual property (IP) in the IC core (e.g., the programmable logic device (PLD) core), from a hard data pattern generator (i.e., a non-configurable data pattern generator), or from the receiver via the reverse serial loopback (i.e., from the receiver/clock data recovery (CDR) circuitry to the transmitter). As will be recognized by those skilled in the art, soft IP in the IC core is reconfigurable logic in the IC core. The data signal and the test data signal may herein also respectively be referred to as data pattern signal and test data pattern signal. Register 112 aligns the data signal with the clock signal and effectively cleans up any jitter accumulated in the data signal. Register 112 provides this data signal (aligned and cleaned up of accumulated jitter) to delay modulator 114.

In one embodiment, delay modulator 114 is a delay chain including inverters connected in series. In another embodiment, delay modulator 114 may be a delay chain including buffers connected in series. In addition to the data signal, delay modulator 114 also receives a delay modulator control signal. The delay modulator control signal may be an analog signal from an analog test pin. Alternatively, the delay modulator control signal may be a digital signal received from the IC core (e.g., a PLD core) through a digital-to-analog (DAC) converter.

The delay modulator control signal controls the amplitude and frequency of the jitter provided by delay modulator 114. The amplitude of the jitter provided by delay modulator 114 is related to the delay provided by delay modulator 114. In one embodiment, the amplitude of the jitter provided by delay modulator 114 may be up to several unit intervals (UIs). The frequency of the jitter provided by delay modulator 114 is related to how often the delay of delay modulator 114 is varied. In one embodiment, the delay of delay modulator 114 is varied between the baseline delay of delay modulator 114 and the baseline delay plus or minus the additional delay for generating the desired magnitude of jitter. The baseline delay of delay modulator 114 is the delay provided by delay modulator 114 at the minimum power supply voltage applied to the delay chain therein. Also, in one embodiment, the frequency of the jitter provided by delay modulator 114 is up to 1 mega Hertz (MHz).

Phase interpolator 122 receives the clock signal and phase shifts it. As a result, the clock signal output by phase interpolator 122 has a phase shift relative to the clock signal received by phase interpolator 122. The phase shift provided by phase interpolator 122 is controlled by the phase modulator control signal. In one embodiment, the phase modulator control signal is provided by soft IP in the IC core (e.g., the PLD core). Alternatively, in another embodiment, the phase modulator control signal may provided by a hard digital pattern generator (i.e., a non-configurable digital pattern generator).

The phase modulator control signal controls the amplitude and frequency of the jitter provided by phase interpolator 122. The amplitude of the jitter provided by phase interpolator 122 is related to the phase shift provided by phase interpolator 122. In one embodiment, the amplitude of the jitter provided by phase interpolator is within 1 UI. In one embodiment, the phase shift of phase interpolator 122 is controlled step-by-step via the phase modulator control signal. The frequency of the jitter provided by phase interpolator 122 is related to how often the phase step of phase interpolator 122 changes. In one embodiment, the frequency of the jitter provided by phase interpolator 122 is up to 100 MHz.

The signal output by phase interpolator 122 is input to the clock input terminal of register 124. Register 124 also receives the output signal of register 112 as an input signal at its data input terminal. As a result, register 124 times the data signal output by register 112 with the phase shifted clock signal provided by phase interpolator 122. In other words, the data signal output by register 112 is retimed by the phase shifted clock signal output by phase interpolator 122. This retimed data signal is provided by register 124 to multiplexer 130.

In pattern and jitter generator 100, multiplexer 130 is a 3 to 1 multiplexer. As such, multiplexer 130 has three input terminals. A first input terminal of multiplexer 130 is coupled to the output terminal of the LFJG 110 (more specifically, the output terminal of delay modulator 114), a second input terminal of multiplexer 130 is coupled to the output terminal of the HFJG 120 (more specifically, the output terminal of register 124), and the third input terminal of multiplexer 130 is coupled to receive the normal transmit data signal. On its first input terminal, multiplexer 130 receives a data signal with low frequency jitter. On its second input terminal, multiplexer 130 receives a data signal with high frequency jitter. Finally, on its third input terminal multiplexer 130 receives a normal transmit data signal. Multiplexer 130 selects one of the signals received on one of its three input terminals and provides the selected signal to transmit driver 140. In other words, multiplexer 130 selects a data signal with low frequency jitter, a data signal with high frequency jitter, or a normal transmit data signal to transmit driver 140.

When it is desired for transmit driver 140 to provide a data signal with low frequency jitter, then multiplexer 130 selects the signal it receives from LFJG 110. On the other hand, when it is desired for transmit driver 140 to provide a data signal with high frequency jitter, then multiplexer 130 selects the signal it receives from HFJG 120. Finally, when it is desired for transmit driver 140 to provide a normal transmit data signal, then multiplexer 130 selects the normal transmit data signal it receives.

In one embodiment, the signal output by transmit driver 140 is provided to a receive driver. The receive driver may be on the same IC as transmit driver 140 or it may be located on another IC. When it is desired to provide a data signal with jitter to the IC on which transmit driver 140 is located, then the signal output by transmit driver 140 is provided to the receive driver of the same IC. On the other hand, when it is desired to provide a data signal with jitter to an IC other than the IC on which transmit driver 140 is located, then the signal output by transmit driver 140 is provided to the other IC. As used herein, an IC on which transmit driver 140 is located refers to an IC which is on the same die as transmit driver 140. Such a transmit driver may be said to be integrated with the IC. Similarly, jitter generator 100 (which includes transmit driver 140) is also on the same die as the IC, i.e., is integrated with the IC. Such a jitter generator is also herein also referred to as an on-die jitter generator. In one embodiment, jitter generator 100 allows instrument-grade on-die measurements of jitter tolerance and other IC characteristics.

It is also to be noted that the jitter (whether low frequency or high frequency) generated by jitter generator 100 is non-intrinsic jitter. In other words, the jitter generated by jitter generator 100 is intentionally generated. As such, the jitter generated by jitter generator 100 is not simply intrinsic jitter that may be present in a data signal sent via a transmit driver. The non-intrinsic jitter may also herein be referred to as injected jitter. It is to be noted that in addition to the non-intrinsic jitter, the jitter output by jitter generator 100 may also include some intrinsic jitter.

In one embodiment, the jitter generated by jitter generator 100 is periodic jitter (PJ), which provides for simpler and better controllability. PJ may also herein be referred to as sinusoid jitter (SJ). The PJ allows for magnitude and frequency control of the generated jitter. Additionally, PJ can be used to generate other types of jitters and, at least theoretically, can be used to generate any other type of jitter. As known by those skilled in the art, examples of other types of jitter include inter symbol interference (ISI), bounded uncorrelated jitter (BUJ), random jitter (RJ), probe width jitter (PWJ), and duty cycle distortion (DCD). Furthermore, in some cases, PJ is required for CDR circuitry testing. Moreover, PJ can be used for receiver equalizer testing.

Figure 2:
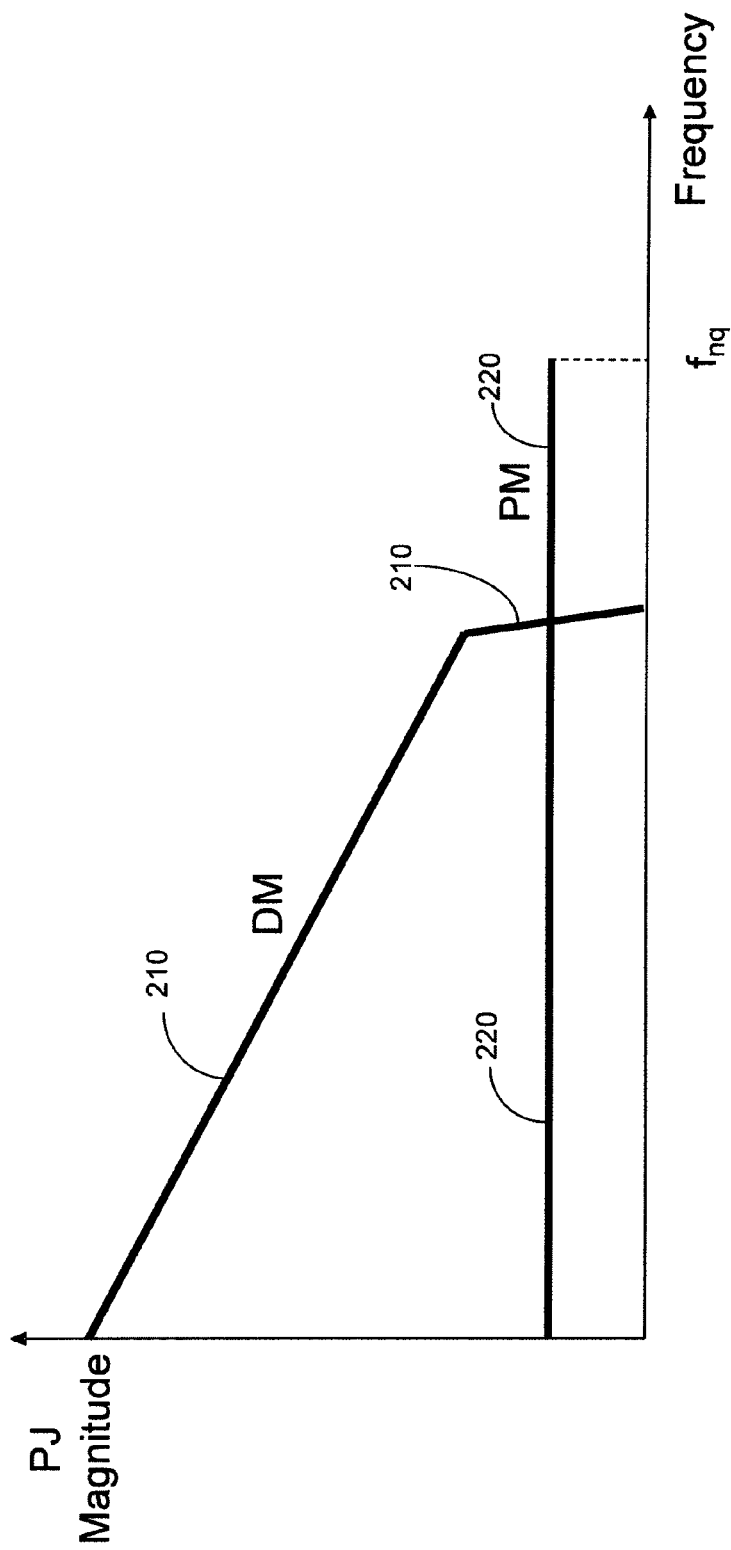
FIG. 2 is an example of the jitter generated by an embodiment of the jitter generator of the present invention.

FIG. 2 is an example of the jitter generated by an embodiment of the jitter generator of the present invention. More specifically, FIG. 2 illustrates an example of the jitter magnitude (particularly PJ magnitude) versus frequency of the jitter generated by an embodiment of the jitter generator of the present invention. In FIG. 2, the low frequency jitter is noted as DM (delay modulated), which is referenced as 210. On the other hand, the high frequency jitter is noted as PM (phase modulated), which is referenced as 220.

As can be seen in FIG. 2, low frequency jitter 210 has a high magnitude at lower frequencies and a lower magnitude (which is eventually phased out) at higher frequencies. On the other hand, high frequency jitter 220 has the same magnitude from the lower frequencies up to $f_{nq}$ (the Nyquist frequency). It is to be noted that this profile of jitter meets requirements set by most high speed serial interface (HSSI) standards, which have a generally high magnitude of low frequency jitter and a relatively low magnitude of high frequency jitter.

The jitter generated by embodiments of the jitter generator of the present invention can be used to test the jitter tolerance of ICs (either the IC including the jitter generator or ICs coupled to the IC including the jitter generator.) In addition to testing the jitter tolerance of ICs, the generated jitter or data pattern signal can also be used to measure other characteristics of the ICs.

Figure 3:
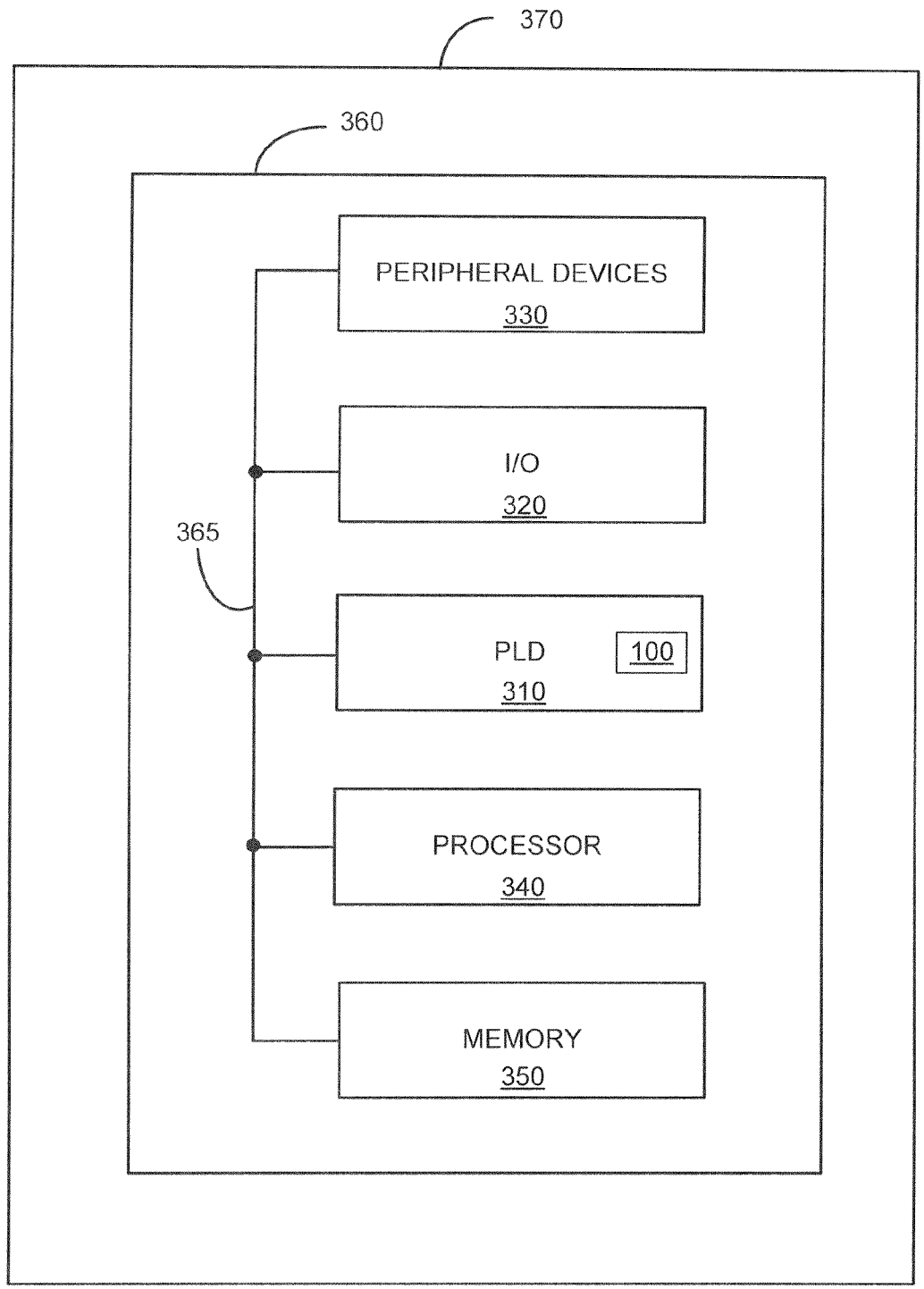
FIG. 3 illustrates an exemplary data processing system including an exemplary IC which includes an embodiment of the jitter generator of the present invention.

FIG. 3 illustrates an exemplary data processing system including an exemplary IC which includes an embodiment of the jitter generator of the present invention.

Circuits including an embodiment of the jitter generator of the present invention might be included in a variety of ICs, including ICs that are PLDs. PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Configuration elements may be realized as random access memory (RAM) bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a "configuration RAM" (CRAM)). However, many types of configurable elements may be used including static or dynamic RAM (SRAM or DRAM), electrically erasable read-only memory (EEROM), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

FIG. 3 illustrates, by way of example, PLD 310 in data processing system 300. As one example, an embodiment of this invention (e.g., jitter generator 100) may be implemented in PLDs, such as PLD 310. In one embodiment, jitter generator 100 is on the same die/chip as PLD 310. In other words, jitter generator 100 is integrated with PLD 310. In one embodiment, the logic and protocols for jitter generator 100 are supported by the programmable PLD core of PLD 310. Data processing system 300 may include one or more of the following components: processor 340, memory 350, input/output (I/O) circuitry 320, and peripheral devices 330. These components are coupled together by system bus 365 and are populated on circuit board 360 which is contained in end-user system 370. A data processing system such as system 300 may include a single end-user system such as end-user system 370 or may include a plurality of systems working together as a data processing system.

System 300 can be used in a wide variety of applications, such as computer networking, data networking, instrumentation, video processing, digital signal processing (DSP), or any other application where the advantage of using programmable or reprogrammable logic is desirable. PLD 310 can be used to perform a variety of different logic functions. For example, PLD 310 can be configured as a processor or controller that works in cooperation with processor 340 (or, in alternative embodiments, a PLD might itself act as the sole system processor). PLD 310 may also be used as an arbiter for arbitrating access to a shared resource in system 300. In yet another example, PLD 310 can be configured as an interface between processor 340 and one of the other components in system 300. It should be noted that system 300 is only exemplary.

In one embodiment, jitter generator 100 may be used to test the jitter tolerance of PLD 310. In another embodiment, jitter generator 100 may be used to test the jitter tolerance of ICs in system 300 other than PLD 310. For example, jitter generator 100 may be used to test the jitter tolerance of processor 340. It is to be noted that jitter generator 100 can be used to test the jitter tolerance of PLD 310 or processor 340 in the field (i.e., while PLD 310 and processor 340 are installed in system 300) without the use of special impedance matched connectors. Jitter generator 100 may also be used to measure other characteristics of PLD 310 or other IC in system 300.

In one embodiment, system 300 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An integrated circuit (IC) comprising:
a jitter generator, wherein the jitter generator is integral with the IC and generates non-intrinsic jitter, wherein the jitter generator comprises:
a low frequency jitter generator (LFJG); and
a high frequency jitter generator (HFJG) coupled to the LFJG;
a multiplexer coupled to the LFJG and HFJG, wherein the multiplexer includes a first input terminal coupled to an output terminal of the LFJG, a second input terminal coupled to an output terminal of the HFJG, and a third input terminal coupled to a normal transmit data signal input.

2. The IC of claim 1, wherein the non-intrinsic jitter is used to test jitter tolerance of the IC.

3. The IC of claim 1 further comprising:
a transmit driver coupled to the multiplexer;
wherein the multiplexer further includes an output terminal coupled to an input terminal of the transmit driver;
further wherein the multiplexer selects an input signal received on one of the first, second, and third input terminals and provides the input signal to the transmit driver.

4. The IC of claim 1, wherein the IC is a programmable logic device.

5. A digital system comprising the IC of claim 1.

6. An integrated circuit (IC) comprising:
a jitter generator comprising:
a low frequency jitter generator (LFJG);
a high frequency jitter generator (HFJG) coupled to the LFJG; and a multiplexer coupled to the LFJG and HFJG, wherein the multiplexer includes a first input terminal coupled to an output terminal of the LFJG, a second input terminal coupled to an output terminal of the HFJG, and a third input terminal coupled to a normal transmit data signal input, wherein the jitter generator is integrated with the IC and generates non-intrinsic jitter, wherein the non-intrinsic jitter is used to measure a characteristic of the IC.

7. The IC of claim 6, wherein the non-intrinsic jitter is used to test jitter tolerance of the IC.

8. The IC of claim 6 further comprising:
a transmit driver coupled to the multiplexer;
wherein the multiplexer further includes an output terminal coupled to an input terminal of the transmit driver;
further wherein the multiplexer selects an input signal received on one of the first, second, and third input terminals and provides the input signal to the transmit driver.

9. The IC of claim 6, wherein the IC is a programmable logic device.

10. A digital system comprising the IC of claim 6.

11. An integrated circuit (IC) comprising:
a jitter generator comprising:
    a low frequency jitter generator (LFJG), wherein the LFJG includes a first register and a delay modulator coupled to the first register;
    a high frequency jitter generator (HFJG) coupled to the LFJG, wherein the HFJG includes a phase interpolator and a second register coupled to the phase interpolator and the first register;
    a multiplexer coupled to the LFJG and HFJG, wherein the multiplexer includes a first input terminal coupled to an output terminal of the LFJG and a second input terminal coupled to an output terminal of the HFJG; and
    a transmit driver coupled to the multiplexer, wherein an input terminal of the transmit driver is coupled to an output terminal of the multiplexer,
    wherein the jitter generator is integrated with the IC and generates non-intrinsic jitter.

12. The IC of claim 11, wherein jitter generated by the jitter generator is used to test jitter tolerance of the IC or another IC device coupled to the IC.

13. The IC of claim 11, wherein the multiplexer further includes a third input terminal coupled to a normal transmit data signal input, further wherein the multiplexer selects between an input signal received on one of the first, second, and third input terminals and provides the input signal to the transmit driver.

14. The IC of claim 13, wherein an output terminal of the delay modulator is coupled to the first input terminal of the multiplexer and an output terminal of the second register is coupled to the second input terminal of the multiplexer.

15. The IC of claim 11, wherein the IC is a programmable logic device.

16. A digital system comprising the IC of claim 11.

17. An integrated circuit (IC) comprising:
a jitter generator, wherein the jitter generator is integral with the IC and generates non-intrinsic jitter, wherein the jitter generator comprises:
    a low frequency jitter generator (LFJG), wherein the LFJG includes a first register and a delay modulator coupled to the first register; and
    a high frequency jitter generator (HFJG) coupled to the LFJG.

18. The IC of claim 17, wherein the HFJG includes a phase interpolator and a second register coupled to the phase interpolator and the first register, the IC further comprising:
a multiplexer coupled to the LFJG and HFJG, wherein the multiplexer includes a first input terminal coupled to an output terminal of the LFJG and a second input terminal coupled to an output terminal of the HFJG, further wherein an output terminal of the delay modulator is coupled to the first input terminal of the multiplexer and an output terminal of the second register is coupled to the second input terminal of the multiplexer.

19. An integrated circuit (IC) comprising:
a jitter generator comprising:
    a low frequency jitter generator (LFJG); and
    a high frequency jitter generator (HFJG) coupled to the LFJG, wherein the HFJG includes a phase interpolator and a first register coupled to the phase interpolator,
wherein the jitter generator is integrated with the IC and generates non-intrinsic jitter, wherein the non-intrinsic jitter is used to measure a characteristic of the IC.

20. The IC of claim 19, wherein the LFJG includes a second register and a delay modulator coupled to the second register, further wherein the first register is coupled to the second register, the IC further comprising:
a multiplexer coupled to the LFJG and HFJG, wherein the multiplexer includes a first input terminal coupled to an output terminal of the LFJG and a second input terminal coupled to an output terminal of the HFJG, further wherein an output terminal of the delay modulator is coupled to the first input terminal of the multiplexer and an output terminal of the first register is coupled to the second input terminal of the multiplexer.

* * * * *